United States Patent [19]

Blum et al.

[11] Patent Number: 5,133,986
[45] Date of Patent: Jul. 28, 1992

[54] PLASMA ENHANCED CHEMICAL VAPOR PROCESSING SYSTEM USING HOLLOW CATHODE EFFECT

[75] Inventors: Joseph M. Blum, Yorktown Heights, N.Y.; Bruce Bumble, Pasadena, Calif.; Kevin K. Chan, Staten Island, N.Y.; Joao R. Conde, Lisbon, Portugal; Jerome J. Cuomo, Lincolndale; William F. Kane, Florida, both of N.Y.

[73] Assignee: International Business Machines Corporation, Armonk, N.Y.

[21] Appl. No.: 593,141

[22] Filed: Oct. 5, 1990

[51] Int. Cl.$^5$ .............................. C23C 16/50
[52] U.S. Cl. .................... 427/39; 118/723; 118/728; 118/733; 156/345; 156/643; 204/192.32; 204/298.34
[58] Field of Search .............. 118/723, 724, 728, 733; 156/345, 643, 646; 204/192.12, 192.32, 298.06, 298.14, 298.34; 427/39, 38

[56] References Cited

U.S. PATENT DOCUMENTS

| | | | |
|---|---|---|---|
| 4,521,286 | 6/1985 | Horwitz | 156/643 |
| 4,569,719 | 2/1986 | Coleman | 427/39 |
| 4,576,698 | 3/1986 | Gallagher et al. | 156/643 |
| 4,637,853 | 1/1987 | Bumble et al. | 156/643 |
| 4,676,195 | 6/1987 | Yasui et al. | 118/723 |
| 4,958,591 | 9/1990 | Yamazaki | 118/723 |
| 4,971,667 | 11/1990 | Yamazaki et al. | 156/643 |

FOREIGN PATENT DOCUMENTS

| | | | |
|---|---|---|---|
| 165618 | 12/1985 | European Pat. Off. | 118/723 |
| 210858 | 2/1987 | European Pat. Off. | |
| 3331261 | 3/1984 | Fed. Rep. of Germany | 118/723 |
| 62-180086 | 8/1977 | Japan | 118/723 |
| 54-33668 | 3/1979 | Japan | 118/723 |
| 60-36661 | 2/1985 | Japan | 118/723 |
| 60-68619 | 4/1985 | Japan | 118/723 |
| 60-68620 | 4/1985 | Japan | 118/723 |
| 62-4872 | 1/1987 | Japan | 427/39 |
| 62-276557 | 12/1987 | Japan | 118/723 |
| 63-26373 | 2/1988 | Japan | |
| 63-33573 | 2/1988 | Japan | 118/723 |
| 63-155054 | 6/1988 | Japan | 427/39 |
| 1-279759 | 11/1989 | Japan | 118/723 |

OTHER PUBLICATIONS

Fortuno-Wiltshire, G. and G. Oehrlein, "Hollow Cathode Etching of Si and $SiO_2$ Using $CF_4$ and $H_2$," J. Electrochem. Soc., vol. 136, No. 5 (May 1989) pp. 1447-1449.
Horwitz, C. and D. McKenzie, "High-Rate Hollow-Cathode Amorphous Silicon Deposition", Applications of Surface Science (Amsterdam) 22/23 (1985) pp. 925-929.

*Primary Examiner*—Shrive Beck
*Assistant Examiner*—Terry J. Owens
*Attorney, Agent, or Firm*—Thomas P. Dowd

[57] ABSTRACT

A high-efficiency, low-temperature, plasma-enhanced chemical vapor deposition (PECVD) system for growing or depositing various types of thin films on substrate surfaces, or etching such surfaces, using substrates of materials such as silicon, plastic, etc. The system uses a hollow-cathode-effect electron source with a surrounding confining electrode to create a plasma at the substrate surface to insure that the density of reactive species is both enhanced and localized at the substrate surface thus causing the rate of growth of the films, or the etch rate, to increase so that the process can take place at much lower temperatures and power levels. A particular embodiment involves the growing of hydrogenated amorphous silicon (a:Si:H), at room temperature, on silicon using a tubular reactor containing a cylindrical electrode lining the inside of the reactor walls acting as a counter electrode for an rf-powered, substrate-supporting electrode near the center of the reactor. A set of silicon wafers, on which the amorphous silicon is grown, is mounted on the latter electrode. The reaction gases (silane) flowing between the electrodes are decomposed in a plasma excited by an rf power source (13.56 MHz) connected to the substrate-supporting electrode. With the use of appropriate deposition parameters (silane flow rate, pressure, applied power and frequency, and substrate spacing) room temperature growth of a-Si:H is achieved at growth rates up to 15 Å/sec, while keeping a low hydrogen concentration (~10%) and the bonded hydrogen in the Si-H monohydride configuration.

25 Claims, 8 Drawing Sheets

FIG. 10

TABLE 1
ANNEALING STUDY OF ROOM TEMPERATURE α-SiH
E(OPT) = 1.7ev
ANNEALING TEMPERATURE = 130 C

| TIME | RT DEP. FILM WITH HCPECVD PROCESS | | | CONVENTIONAL PECVD PROCESS |
|---|---|---|---|---|
| | AS DEPOSITED | 9 HOURS | 20 HOURS | 300 C DEPOSITION |
| DARK CONDUCTIVITY | $5.2 \times 10E-11$ | $3.6 \times 10E-11$ | $5.2 \times 10E-11$ | $10E-11$ |
| PHOTO CONDUCTIVITY | $1.3 \times 10E-9$ | $5.5 \times 10E-7$ | $1 \times 10E-6$ | $10E-6$ |
| ACTIVATION ENERGY | 0.43 | 0.76 | 0.72 | 0.76 TO 0.8 |
| DEPOSITION RATE | 15 A/SEC | | | 1 A/SEC |

PLASMA ENHANCED CHEMICAL VAPOR PROCESSING SYSTEM USING HOLLOW CATHODE EFFECT

BACKGROUND OF THE INVENTION

1. Field of the Invention

The present invention relates to plasma sputter/etching and more particularly to a high efficiency, low temperature system for growing or depositing various types of thin films on substrate surfaces, or etching such surfaces, using an improved hollow-cathode enhanced plasma at the substrate.

2. Prior Art

It is known that during plasma or RIE etching the use of a hollow-cathode electron source in the process significantly increases the presence of active etching species by increasing the electron density in the region of the etched surface so that the etching process takes place at a much faster rate or at a lower power level. See, for instance, U.S. Pat. No. 4,637,853 to B. Bumble et al and IBM TDB Vol. 28, No. 10, pps. 4294-7, March, 1986. The phenomenon of hollow-cathode discharge is explained in detail by C. M. Horwitz in Appl. Surf. Science 22/23, 925 (1985). Also, see his U.S. Pat. No. 4,521,286.

Enhanced growth of thin films is also possible with this phenomenon for the same reason and can be used to provide all the advantages to VLSI technology that low processing temperatures and high growth rate will offer. For example, reduced thermal exposure during oxidation can significantly reduce "bird's beak" which in turn will allow higher density circuits to be fabricated. In addition, less damage to the silicon/oxide interface will result due to the reduced power needed for this approach compared to other plasma systems.

One important area of film growth in VLSI technology is the production of hydrogenated amorphous silicon. Hydrogenated amorphous silicon (a-Si:H) has been intensively studied since Chittick et al achieved a dramatic reduction of the gap defect state density by using a glow discharge growth technique. See R. C. Chittick, J. H. Alexander, and H. F. Sterling, J. Electrochem. Soc. 116, 77 (1969). Subsequently, Spear and LeComber were able to substitutionally dope these films. See W. E. Spear and P. G. LeComber, Solid State Commun. 17, 1193 (1975) in this regard. Amorphous Si:H is now widely used in devices that require a large-area, and low-cost, low-temperature processing, e.g., solar cells, thin-film transistors for displays, electrophotography sensors, photodetectors, and light-emitting diodes. For a comprehensive review of this technology, see, for example, A. Madan and M. P. Shaw, *The Physics and Applications of Amorphous Semiconductors* (Academic Press, Boston, 1988), or J. I. Pankove, Ed., *Hydrogenated Amorphous Silicon*, in *Semiconductors and Semimetals*, volume 21 (Academic Press, Orlando, 1984).

As early as 1980, Knights concluded that optimal a-Si:H growth conditions led to a very low growth rate on the order of 0.5-1 Å/sec. See J. C. Knights, J. Non-Cryst. Solids 35/36, 159 (1980), and also A. Matsuda and K. Tanaka, J. Non-Cryst. Solids 97/98, 1367 (1987). A number of methods were suggested to increase the growth rate. For example, K. Ogawa, I. Shimizu and E. Inoue, in Japan. J. Appl. Phys. 20, L639 (1981), suggest the use of higher silanes as the silicon source gas. Very-high frequency rf glow discharge is discussed by H. Curtins, N. Wyrsch, M. Favre and A. V. Shah, in Plasma Chem. Plasma Process. 7, 267 (1987). The use of a grounded mesh peripherally surrounding parallel plate electrodes is described by T. Hamasaki, M. Ueda, A. Chayahara, M. Hirose, and Y. Osaka, in Appl. Phys. Lett. 44, 600 (1984). See also U.S. Pat. No. 4,633,809 to Hirose et al. Hydrogen-radical enhanced CVD, and hollow-cathode discharge are respectively suggested in Japan. J. Appl. Phys. 26, L10 (1987), by N. Shibata, K. Fukuda, H. Ohtoshi, J. Hanna, S. Oda, and I. Shimizu, and in the above-cited Appl. Surf. Science 22/23, 925 (1985) by C. M. Horwitz. Although optimal a-Si:H is usually deposited at temperatures between 200° and 300° C., deposition at lower temperatures was also attempted as described by Y. Ziegler, H. Curtins, J. Baumann and A. Shah, in Mat. Res. Soc. Symp. Proc. 149, 81 (1989) and references therein, and by G. Lucovsky, B. N. Davidson, G. N. Parsons, and C. Wang, in J. of Non-Cryst. Solids 114, 154 (1989). The motivation for achieving lowering temperature deposition was the ability to use heat sensitive materials as substrates. Furthermore, the discovery, reported by Z. E. Smith and S. Wagner, in Phys. Rev. B 32, 5510 (1985), that defects in a-Si:H participate in chemical equilibrium reactions, stimulated the study of the properties of samples deposited at lower temperatures (from room temperature up to 100° C.), reported by R. A. Street and K. Winer, Mat. Res. Soc. Symp. Proc. 149, 131 (1989).

It is accordingly desirable in the art to have a high-efficiency system for depositing or growing films on, or etching, substrate surfaces, and particularly, to have, for example, an rf glow-discharge system for growing hydrogenated amorphous silicon (a-Si:H), at room temperature, on silicon.

The present invention improves upon prior art hollow-cathode-effect devices for sputter/etching by a technique which enhances plasma-produced growth or deposition of films on substrate surfaces, or the etching of such surfaces, and an apparatus design which will do so efficiently on silicon wafers. In a particular embodiment the present invention provides a new high-growth-rate technique for a-Si:H deposition.

SUMMARY OF THE INVENTION

The present invention involves plasma-enhanced chemical vapor processing and particularly a high-efficiency, low-temperature system for growing or depositing various types of thin films on workpieces such as substrate surfaces, or etching such surfaces, using substrates of materials such as silicon, germanium, gallium arsenide, glass, plastic, and other suitable materials. The system uses a hollow-cathode-effect electron source with a surrounding confining electrode to create a plasma at the substrate surface, or preferably between spaced surfaces, which arrangement insures that the density of reactive species is both enhanced and localized at the substrate surfaces thus causing the rate of growth of the films, or the etch rate, to increase so that the process can take place at much lower temperatures and power levels.

A preferred embodiment of the invention is its application in a plasma-enhanced chemical vapor deposition (PECVD) system and particularly an rf glow-discharge system for growing hydrogenated amorphous silicon (a-Si:H), at room temperature, on silicon. The embodiment comprises a tubular reactor, containing a generally concentric electrode arrangement including a set of spaced substrates supported axially therein, for accomodating hollow-cathode effect, plasma-enhanced, chemical vapor deposition (HC-PECVD) on, or processing of, the substrate surfaces. The cylindrical, concentric-electrode arrangement provides improved confinement of and enhanced hollow-cathode effects in the plasma produced at each substrate surface, permitting low temperature and pressure deposition of material from the chemical vapor onto the substrates. More particularly, the reactor consists of an outer quartz tube, defining the reaction chamber, with a cylindrical electrode adjacent the inside of the reactor wall acting as a counter electrode for an rf-powered electrode which is in electrical contact with and supports the substrates at the center of the reactor. The substrates are in the form of a set of spaced silicon wafers, on which the amorphous silicon is to be grown, and may be disposed in a wafer boat. The boat is mounted on the latter electrode which may be paddle-shaped to accomodate it. The plasma is produced from reaction gases, such as silane in the present embodiment, which are decomposed into a plasma excited by an rf power source (13.56 MHz) connected to the paddle-shaped electrode. The gas flows between the electrodes and may be admitted at one end of the reactor and pumped out at the opposite end. The electrode material is silicon carbide made conductive by the presence of crystalline silicon inclusions. Using appropriate deposition parameters (silane flow rate, pressure, electrical power and frequency, and substrate spacing) room temperature growth of a-Si:H is achieved at growth rates up to 15 Å/sec, while keeping a low hydrogen concentration ($\sim 10\%$) and the bonded hydrogen in the Si—H monohydride configuration.

A particular example for growing device quality amorphous silicon at room temperature (23° C.) in the disclosed reactor involves a set of parameters such as follows:

Gas = 100% SiH4 (silane)
Pressure = $25 < P < 100$ millitorr
Power = $10 < Pw < 150$ watts
Gas Flow = $10 < F < 50$ sccm
Temperature = 23° C.
Growth Rate = $100 < GR < 1000$ A/min Using this process amorphous silicon films may be formed on substrates or devices that have serious temperature limitations, thus extending the range of materials that can be used in such device applications.

The confining-electrode reactor of the invention may be used in a large number of applications with various gases and materials to produce improved treatment of substrate surfaces to deposit or grow films thereon or etch patterns therein.

BRIEF DESCRIPTION OF THE DRAWINGS

FIG. 10 is a Table setting forth a comparison of a-Si:H film characteristics for a film resulting from conventional PECVD deposition processing (300° C.) versus a film produced by the HC-PECVD process (room temperature) of the invention and the effects of annealing those films in an inert gas.

DETAILED DESCRIPTION OF THE INVENTION

Figure 1:
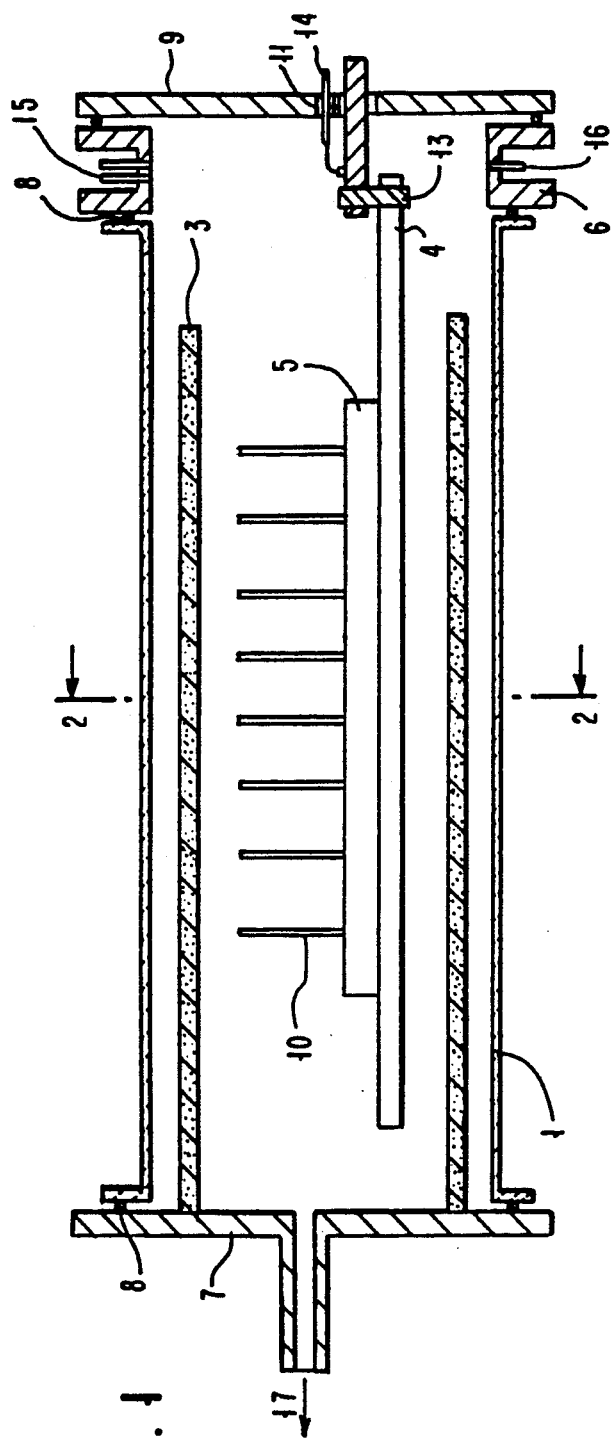
FIG. 1 is a diagrammatic illustration of a preferred form of a plasma reactor in accordance with the present invention.

A preferred plasma reactor in accordance with the present invention is shown in FIG. 1. The structure of the apparatus is made up essentially of three component sections conveniently identifiable by their preferred materials of construction, i.e., quartz, silicon carbide, and stainless steel. While these materials are preferred, those of skill in the art may wish to substitute other suitable materials as may be found to be appropriate.

First, the quartz section is in the form of a cylindrical reaction chamber 1 which is the heart of the reactor wherein the controlled plasma reaction takes place. The desirable properties of insulation, high temperature stability, and ultra-high purity make quartz the preferred material for this structure.

Figure 2:
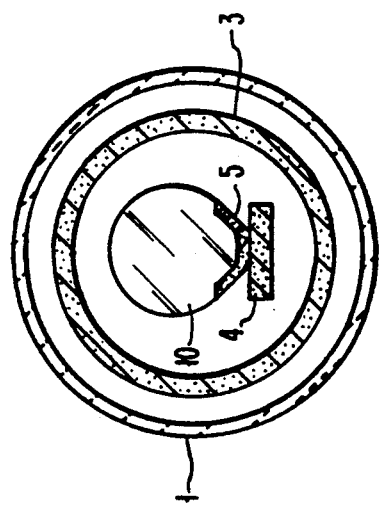
FIG. 2 is a diagrammatic sectional view, taken along the lines 2—2 in FIG. 1, illustrating one configuration of a wafer boat which when loaded with wafers as shown makes up part of the hollow-cathode arrangement.
Figure 3:
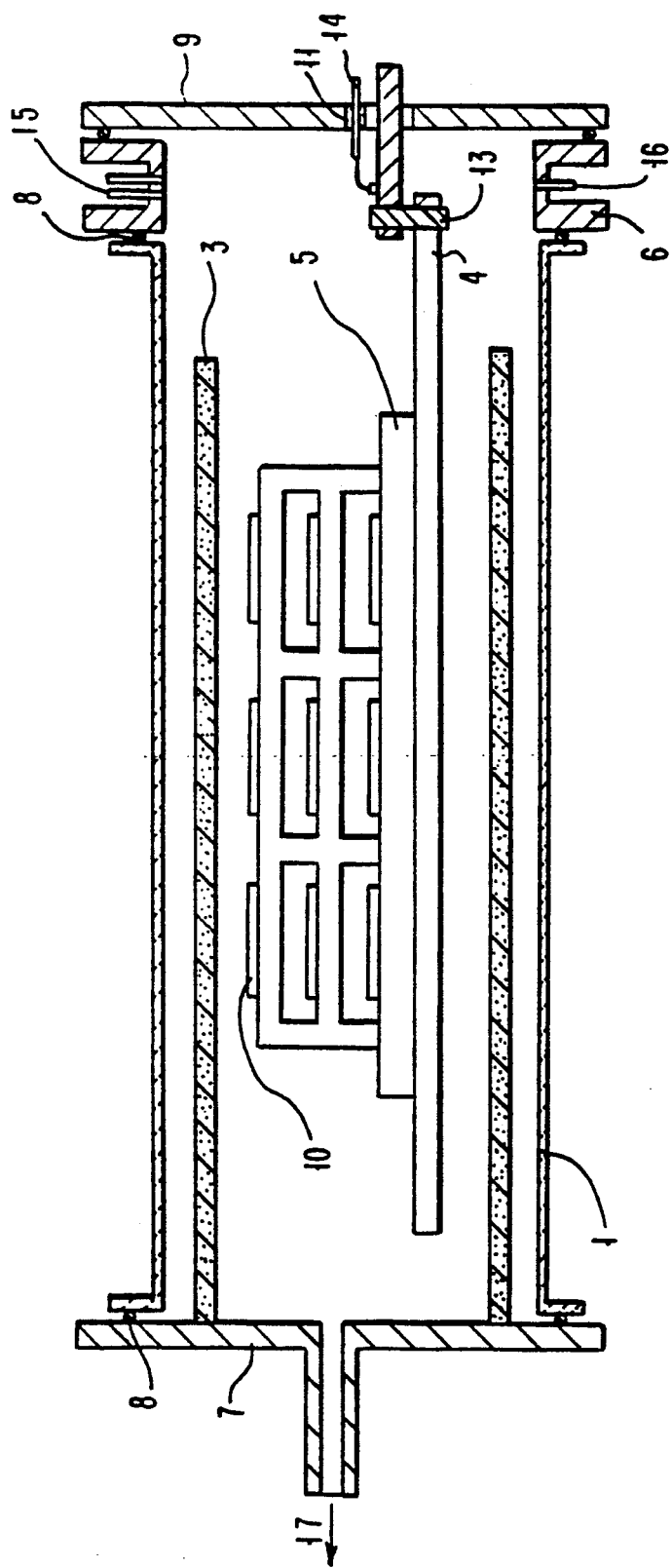
FIG. 3 is an illustration as in FIG. 1 showing another configuration of a wafer boat which when loaded with wafers as shown makes up part of the hollow-cathode arrangement.

Second, a silicon carbide cathode section is constructed from three components—an outer tubular electrode 3, an inner cantilevered electrode 4, which may be in the form of a boat paddle for holding the third component, a wafer boat 5. All three of these parts are disposed within the quartz chamber 1 and are made of high purity silicon carbide because of its desirable combination of properties, i.e., ultra-high purity, very good thermal stability, strength at elevated temperatures (capable of supporting a loaded wafer boat), and conductivity, due to its being impregnated with high purity silicon powder during fabrication. Conductivity is important as the material is part of the cathode structure. FIGS. 1 and 2 illustrate one configuration for the wafer boat 5, which when loaded with wafers 10, in a vertical orientation as shown, makes up part of the hollow-cathode arrangement. For descriptive purposes this vertical arrangement will be primarily discussed but it will be understood from the following description that the alternate wafer boat arrangement with horizontally oriented wafers, shown in FIG. 3, should give substantially equivalent results. While circular wafers are shown, it will also be understood that the workpieces disposed at the center of the reactor for operation of the plasma thereon may take many shapes and forms to suit the ends of any particular process being carried out in the reactor. Similarly, the reaction chamber 1 and surrounding electrode 3 may be other than circular in cross-section, but the cylindrical configuration is preferred, with the reactor having an elongated axis and the electrodes arranged parallel thereto. In some applications the surrounding electrode 3 might act as the chamber wall.

The third section shown in FIG. 1 is the stainless steel section which includes three members: dual-flanged end cap 6; end cap 7; and door 9. End caps 6 and 7 are vacuum sealed to the quartz center section 1 at its opposite flanged ends by O-rings 8, and door 9 is similarly joined to end cap 6. Provision is made between the flanges in end cap 6 for the attachment of gas input lines 15 and pressure sensors 16. The paddle electrode 4 is connected to the door 9 in a cantilevered arrangement which includes a paddle electrode holder 12 and a clamp 13 that joins the paddle 4 and the holder 12. Electrical power to the paddle electrode 4, which acts as a cathode, is fed through a wire connection between holder 12 and a power electrode 14. The power electrode 14 and holder 12 are both electrically isolated from the door 9 by TEFLON and ceramic, vacuum-tight, feed-thrus 11. The surrounding tubular electrode 3 is supportingly connected to end cap 7, which also accomodates a connection 17 to a vacuum source or pump (not shown) for evacuating the chamber 1.

Figure 4:
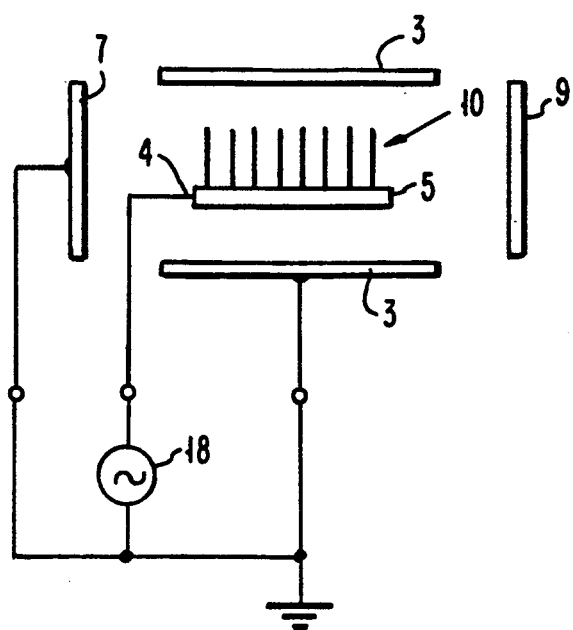
FIG. 4 is a schematic diagram of one circuit configuration for connecting an rf power source to the cathode arrangement of FIG. 1.
Figure 5:
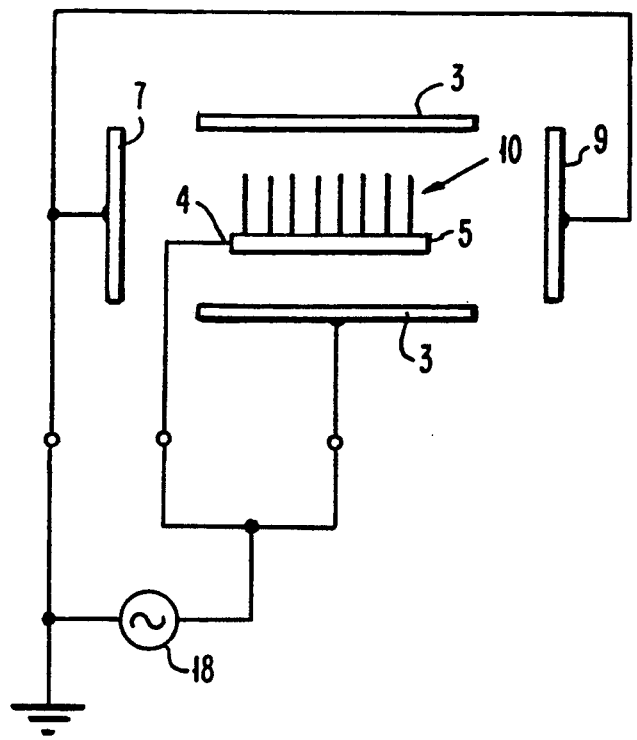
FIG. 5 is a schematic diagram of an alternate circuit configuration to that of FIG. 4 for connecting an rf power source to the cathode arrangement of the invention.

The electrodes are powered from an rf generator 18 which may be connected in the manner of either of the two circuit arrangements shown in FIGS. 4 and 5. As seen in FIG. 4, the tubular electrode 3 and end cap 7 are grounded and the rf voltage is applied to the paddle electrode 4 containing the wafer boat 5 of FIGS. 1 and 2 with a set of vertical workpieces or wafers 10 mounted thereon, such that the electrode, boat, and wafers all act to form a cathode. In the arrangement of FIG. 5, end cap 7 is electrically isolated from tubular electrode 3 and is grounded along with door 9, while both electrode 3 and paddle electrode 4 are connected to the rf source 18. It is also contemplated that a source of dc power may be used as appropriate. In either event, the applied electrical power will create, either directly through a conductive substrate or through a "skin effect", an electric field at each substrate or wafer surface causing excitation of the gas in the spaces between the wafers to produce a plasma with enhanced hollow-cathode effect therein.

A heating furnace may be provided, for producing any additional thermal energy necessary to the enhancement of the process, but is not shown for simplicity as the provision of a suitable device for this purpose will be within the purview of those of skill in the art.

With the system shown in FIG. 1, high-efficiency deposition or growing of films on, or etching, the surfaces of the wafers may be achieved in the general manner as follows. A set of wafers 10, in the form, for example, of a number of silicon substrates, is disposed on electrode 4 in boat 5 in the reaction chamber 1. The wafers are spaced from each other to expose their surfaces for the desired reaction with the plasma to be formed. For instance, when the reactor is used to deposit a film on the wafer surfaces, the quality and uniformity of the deposited film will ultimately be a function of the spacing between the wafers and appropriate process parameters, such as the pressure in the reaction chamber 1, the species and flow rate of the reacting gas, and the power and frequency of the applied voltage, all of which may be adjusted to optimize the desired result. By way of a general example, the system of the preferred embodiment may be found to operate optimally with a judicious choice of a combination of parameters such as a pressure in the range from about 10 to 500 millitorr with a constant flow of reactant gas through the chamber 1 at a rate between 5 and 75 sccm. The reactant gas may be silane when depositing silicon film on a silicon wafer surface, and may be oxygen if growing an oxide on the silicon surface. The temperature may be at 23° C. (room temperature) or above and the applied electrical power may be in the range from 10 to 300 watts and at the conventional rf frequency of 13.56 MHz. The appropriate spacing of the wafers will depend upon the system sizing and typically may be of the order of about 0.1 to as much as 5 inches in a chamber of about 3 feet in length and 7 inch diameter.

When rf power (e.g., 13.56 MHz) is applied to the electrode configuration of the present invention, a hollow-cathode-type glow discharge will result between each wafer. For a thorough understanding of the glow discharge phenomenon, a detailed explanation of the hollow cathode discharge may be found, as noted above, in Appl. Surf. Science 22/23, 925 (1985). With the present invention, the dense plasma produced by the hollow-cathode effect between the wafers will provide increased chemically-active species localized at the wafer surfaces thus enabling film growth, deposition, or etching, to take place at a significantly lower temperature than achievable with previous PECVD devices for this purpose. In particular, with regard to film deposition, the generally cylindrical, concentric-electrode arrangement provides improved confinement of and hollow-cathode effects in the plasma produced at the substrate surfaces, permitting low temperature and pressure deposition of material from the chemical vapor on the wafers.

A particular example of an application of the present invention is the production of hydrogenated amorphous silicon. As noted above, hydrogenated amorphous silicon (a-Si:H) is widely used in devices that require a large-area and low-cost, low-temperature processing, e.g., solar cells, thin-film transistors for displays, electrophotography sensors, photodetectors, and light-emitting diodes. The present invention provides a new high-growth-rate technique for a-Si:H deposition. During the development of the technique, the deposition parameters were systematically varied in order to study their influence on the properties of the film deposited at room temperature. It is noted that an important characteristic of this deposition method is the degree of control of the hydrogen bonding configuration that can be achieved.

An example of one embodiment of the present invention using the improved technique and involving the production of hydrogenated amorphous silicon will now be described in some detail with reference to the concentric-electrode PECVD reactor shown in FIG. 1. In this embodiment the reactor chamber 1 consists of a 3 feet long, 7-inch diameter quartz tube and contains a grounded, cylindrical electrode 3, lining the inside of the reactor walls, providing a counter electrode for the rf-powered, paddle-shaped electrode 4 near the center of the chamber. The electrode material is silicon carbide made conductive by the presence of crystalline silicon inclusions. The reaction gases are admitted to the chamber 1 through an inlet 11 located at one end of the reactor and are decomposed in a plasma excited by an rf field at 13.56 MHz. The reactor is pumped at the opposite end by a roots blower connected in series to a roughing pump (not shown).

With the use of such a reactor, a number of samples were deposited at room temperature from silane. Three series of experiments were performed. In the first series, the flow of silane was varied between 6 and 60 sccm (flow rate in cubic centimeters per minute at standard temperature and pressure), while the pressure and rf power were kept constant at 0.05 Torr and 75 W, respectively. In the second series, the pressure was systematically varied between 0.015 and 0.4 Torr, while keeping a silane flow of 15 sccm and a 75 W rf power. Finally, the third series covered a range of power levels between 25 and 275 W, with a constant silane flow rate (15 sccm) and pressure (0.05 Torr). Quartz substrates were used for the optical transmission measurements, while double-side-polished silicon wafers were used for the infrared absorption measurements.

The thickness of the deposited films was measured using a TENCOR ALPHA-STEP 200 surface profiler. The results of these measurements agreed with the thickness derived from the interference fringe spacing in the near-IR region measured using optical transmission. The optical transmission measurements were made using VARIAN CARY, 2400 ultraviolet-visible-near infrared spectrophotometer. The intercept from Tauc plots of $(\alpha h\omega)^{\frac{1}{2}} = B(h\omega - E_{opt})$ was taken as $E_{opt}$. The infrared transmittance spectra were measured in a range between 200 and 4000 cm$^{-1}$ using a PERKIN-ELMER 283 infrared spectrophotometer. The hydrogen concentration in the film was estimated from the integrated intensity of the bond stretching band in the 2000–2100 cm$^{-1}$ region of the spectra using $N_H = 1.4 \times 10^{20}$ cm$^{-2} \int \alpha(\omega)/\omega d\omega$, where $N_H$ is the concentration of hydrogen bonds, and $\alpha$ the absorption coefficient (See C. J. Fang, K. J. Gruntz, L. Ley and M. Cardona, J. Non-Cryst. Solids 35/36, 255 (1980)). The Si—H/Si—H$_2$ ratio was estimated (in accordance with P. J. Zanzucchi, in the above-noted *Hydrogenated Amorphous Silicon*, J. I. Pankove Ed., pg. 113, in *Semiconductors and Semimetals*, volume 21, Part B (Academic Press, Orlando, 1984) and references therein) as the ratio of the absorption coefficients at 2000 and 2100 cm$^{-1}$, respectively. Raman spectra were measured in the back-scattering geometry using 538.9 nm excitation and 2 cm$^{-1}$ resolution.

The improved results achieved with the reactor of the present invention are believed to arise from the combination of the plasma confinement and the hollow-cathode effects. It is theorized that the concentric-confining-electrode PECVD technique of the invention achieves a somewhat similar effect to that resulting from the use of a ground mesh surrounding the two parallel plate electrodes in conventional diode rf glow discharge. As discussed by Hamasaki et al. in the reference cited above, the use of the ground mesh strongly increases the ratio of the area of the powered electrode ($A_P$) to the area of all the other surfaces in contact with the plasma ($A_G$). If the simplifying assumption is made that the distance (h) between the parallel electrodes in conventional diode glow-discharge is approximately equal to the electrode radius (r), i.e., $r \sim h$, this ratio becomes $A_P/A_G \sim \frac{1}{3}$ (since $A_P = \pi r^2$ and $A_G = \pi r^2 + 2\pi rh$). This enhancement of the $A_P/A_G$ ratio causes an increase of the plasma potential ($V_P$) and a decrease of the self bias potential ($V_S$). The increase in $V_P$ is attributed by Hamasaki et al. and B. Chapman, in *Glow Discharge Processes* (John Wiley & Sons, New York, 1980), to the plasma confinement, and its net effect is equivalent to an increase in power. In the concentric-electrode configuration of the invention (FIG. 1), far away from the electrode edges, $A_P/A_G$ becomes $\sim 1/\pi$ if a similar simplifying assumption is made, i.e., that the radius (r) of the outer electrode 3 -anode- is approximately equal to the width (l) of the inner electrode 4 -cathode- (since, in this case, $A_G = 2\pi rL$ and $A_P = 2\pi lL$, where L is the length of the reactor chamber). It is then speculated that a plasma with a high degree of dissociation and a very symmetric potential distribution results from the concentric-electrode configuration of this HC-PECVD system. In addition to the confinement effect, the more symmetric potential distribution induces a hollow-cathode effect. The hollow-cathode effect occurs when two similarly biased electrodes face each other, creating an "electron mirror" that enhances the electron confinement at low pressures.

The glow discharge deposition of thin films is a complex multistep process. There is considerable discussion by Chittick et al. in J. Electrochem. Soc. 116, 77 (1969) and Shibata et al. in Japan. J. Appl. Phys. 26, L10 (1987), both noted above, as to: which species, from those generated by the fragmentation of silane, is the main thin film precursor; which factors control the mobility of the adsorbed film precursor; and what is the dehydrogenation mechanism that allows the network propagation. These questions remain largely unresolved. It was therefore necessary, presented with a novel deposition technique, to perform an empirical study of the effect of the deposition conditions on the film quality.

Figure 6:
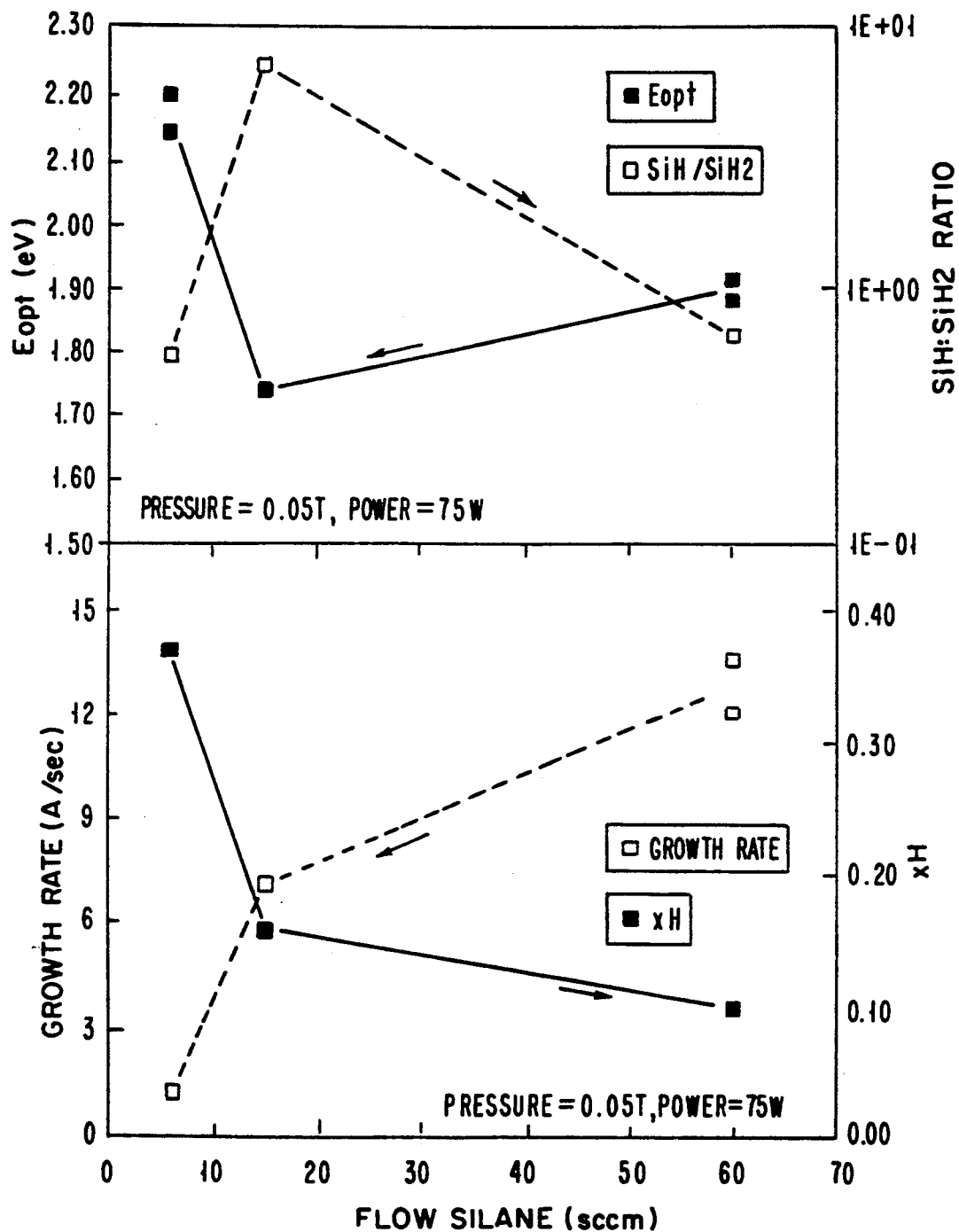
FIG. 6 illustrates the effect of varying the flow of silane gas in the reaction chamber on the properties of the film produced on the wafers.

FIG. 6 illustrates the effect of varying the flow of silane on the film properties as obtained from such a study. The film properties are seen to be very sensitive to the silane flow. At low silane flows (6 sccm) a poor quality of a-Si:H film is obtained. This film shows high hydrogen concentration ($x_H \sim 0.4$), and predominance of the dihydride hydrogen bonding (the SiH/SiH$_2$ ratio is less than 1) which suggests the presence of microstructure. The high hydrogen concentration raises the optical bandgap above 2 eV. Although these film characteristics are similar to those of low-temperature (<150° C.) a-Si:H grown using conventional diode rf glow-discharge (See Y. Ziegler, H. Curtins, J. Baumann and A. Shah, Mat. Res. Soc. Symp. Proc. 149, 81 (1989) and references therein), they also correspond to deposition conditions that cause silane depletion in the gas phase (i.e., when the dwell time of the species in the reactor is long compared with the reaction half time for the silane fragmentation). When the silane flow is increased to 15 sccm, the material quality improves dramatically: $x_H$ drops to $\sim 0.15$; the dominant hydrogen bonding configuration is the Si—H monohydride; the optical gap is reduced to 1.7 eV; and the deposition rate increases 7-fold. With the use of the set of diagnostics shown in FIG. 6, this room-temperature deposited material is indistinguishable from high-temperature (>200° C.) device-quality a-Si:H samples. The deposition rate, on the other hand, is much higher than for samples showing the same predominance of the monohydride configuration deposited using conventional diode rf glow discharge (See K. Ogawa, I. Shimizu and E. Inoue, Japan. J. Appl. Phys. 20, L639 (1981)). Further increase of the silane flow (60 sccm) induces a degradation in the film properties (as indicated by the optical gap increase and the low SiH/SiH$_2$ ratio with respect to the sample grown at 15 sccm). It is interesting to note that although this pronounced shift from the monohydride to dihydride bonding configuration occurred when the silane flow was raised from 15 to 60 sccm, the total hydrogen content in the film did not appear to change appreciably.

Figure 7:
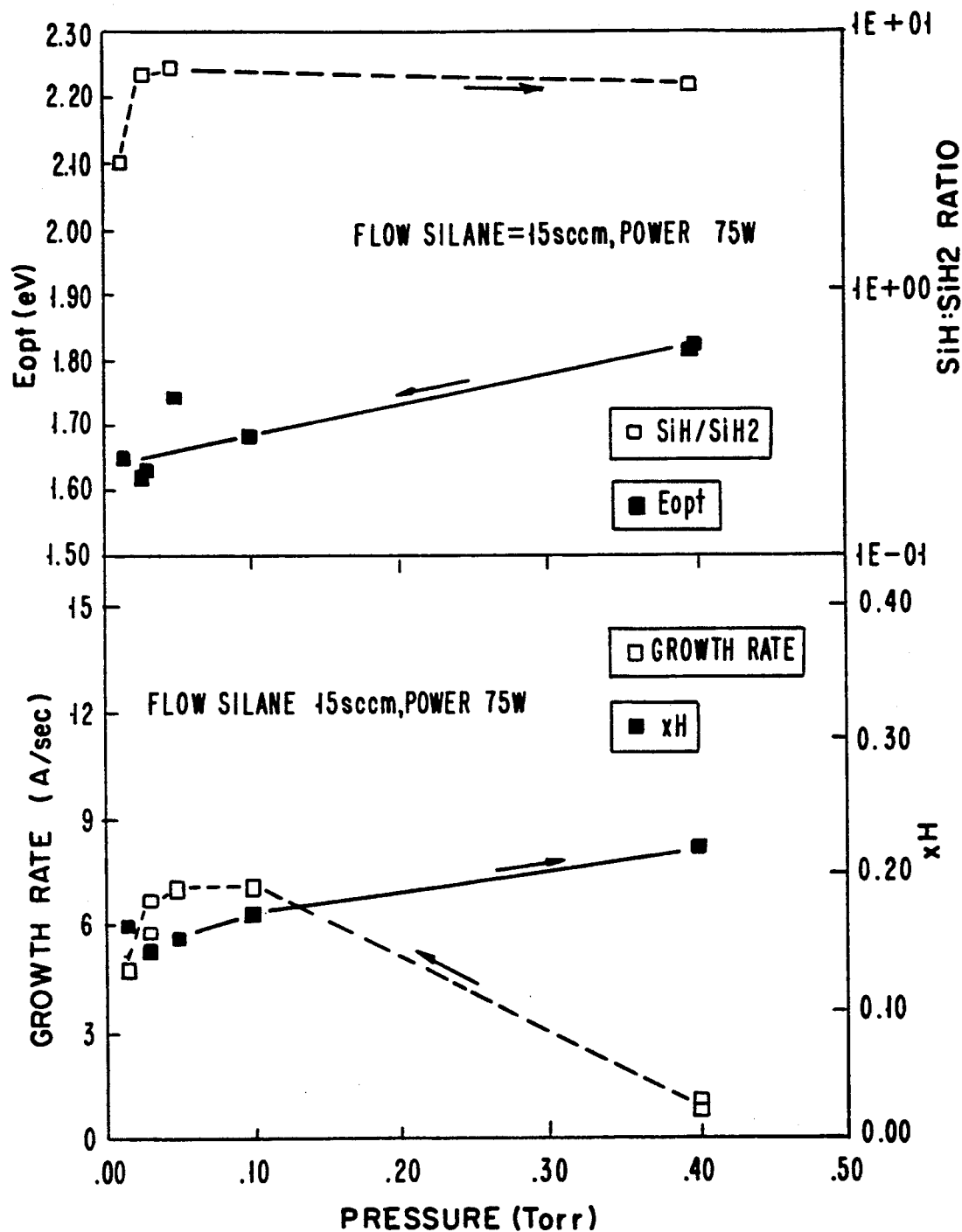
FIGS. 7 and 8 show the effects of the variation of deposition pressure and power, respectively, on the properties of the film produced on the wafers.
Figure 8:
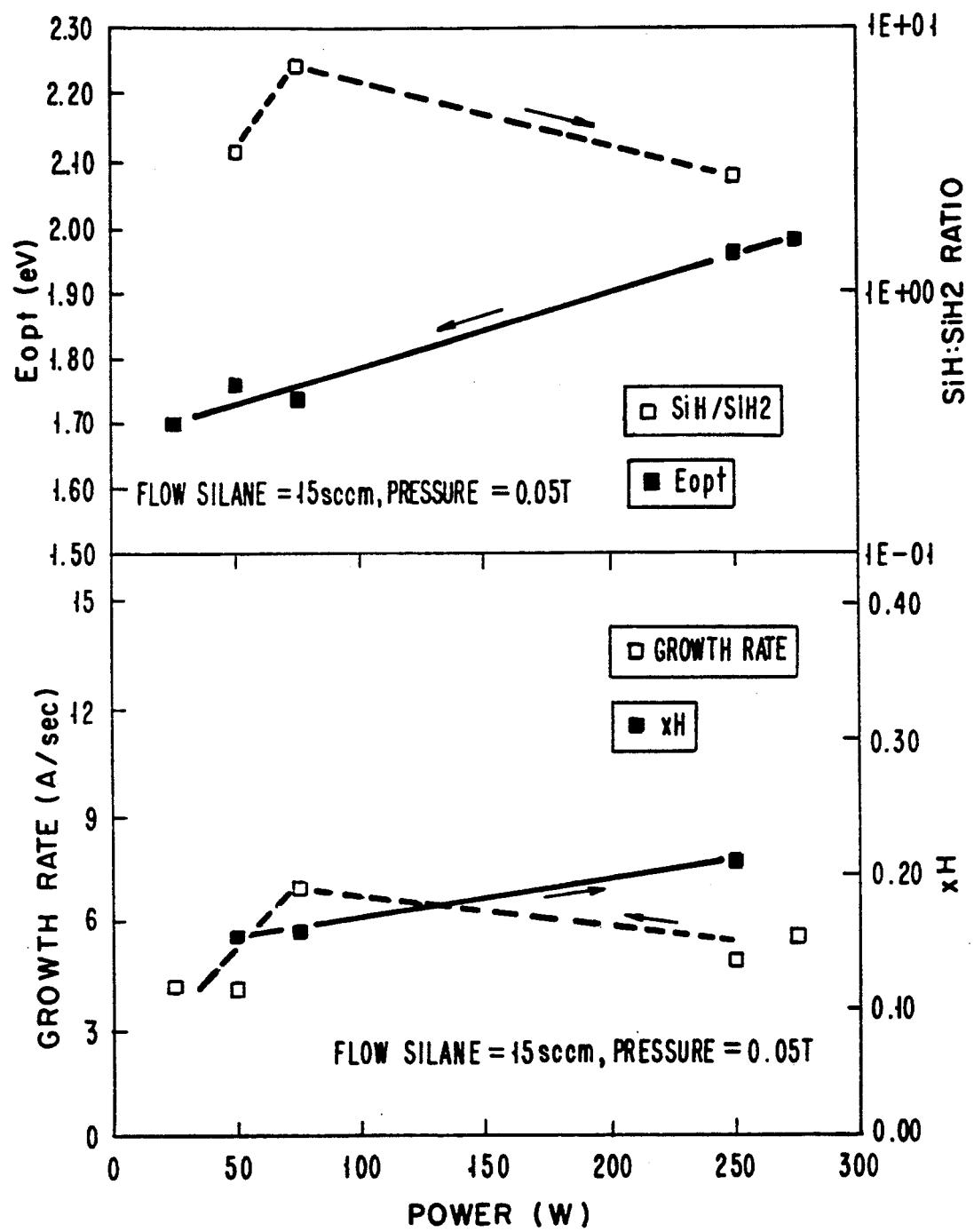

FIGS. 7 and 8 show the effects of the variation of deposition pressure and power, respectively. The dominant feature of FIG. 7 is the slow degradation of the film properties as the pressure is increased (as indicated by the increase of the hydrogen content and optical bandgap and the decrease of the monohydride to dihydride bonding ratio). During high pressure deposition (~0.4 Torr) extensive gas phase nucleation was observed. This phenomenon is apparently responsible for the decrease of the growth rate and the film quality degradation. At the other extreme pressure condition (~0.01 Torr) it appears that the mean free path of the species in the gas phase is high enough so that collisions with the reactor walls become the dominant deactivation mechanism and the confinement effect is lost. The effect of varying the power level on the properties of the a-Si:H films is shown in FIG. 8. As the power is increased, a steady degradation of the film properties is observed (as indicated by the increase of the hydrogen content and the optical bandgap, and by the decrease of the $SiH/SiH_2$ ratio). The high power deposition results are comparable to that of low silane flow. At high power levels, silane depletion is also observed.

Figure 9:
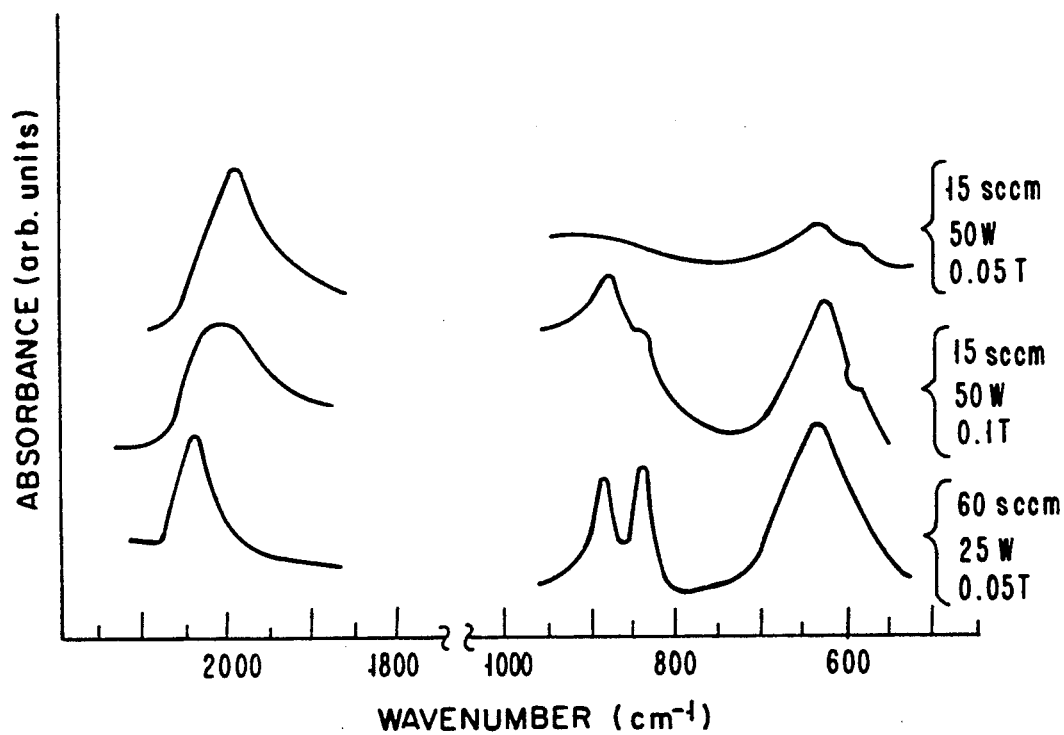
FIG. 9 illustrates the dramatic effects that different deposition conditions have on the structural characteristics of the room-temperature-deposited a-Si:H films produced by the concentric-electrode HC-PECVD process of the invention.

Finally, FIG. 9 illustrates and emphasizes the dramatic effects that different deposition conditions have on the structural characteristics of the room-temperature deposited a-Si:H concentric-electrode PECVD films. The hydrogen bonding configuration is very sensitive to the deposition conditions. By increasing the flow of silane from 15 to 60 sccm, the dominant bonding configuration is changed from monohydride to dihydride. A two-fold increase in the deposition pressure (from 0.05 to 0.1 Torr) changes the bonding configuration to one in which both Si—H and Si—$H_2$ are present in comparable amounts. On the other hand, Raman measurements yielded a full-width at half-maximum scatter between 68 and 80 cm$^{-1}$ for the TO-like band.

It will be seen from the foregoing description that an improved concentric-confining-electrode configuration is presented for thin film deposition using an rf glow discharge plasma. The structure of a-Si:H films deposited at high growth rate and at room temperature can be tuned from one in which the dominant Si—H bonding configuration corresponds to the dihydride mode to one in which the monohydride form is exclusively present. The correlation between the film structure and the deposition conditions is established. The a-Si:H film quality is strongly dependent on the flow of silane during deposition but it is less sensitive to the reactor pressure and rf power. Finally, the two-dimensional characteristics of this tubular deposition system make it very attractive for large-area, high-throughput thin film production.

An exemplary process for growing device quality amorphous silicon at room temperature (23° C.) on one or more wafers in the described reactor, with the wafer spacing not being critical, has been found to be operable using the system within the following set of parameters:

Gas = 100% SiH4 (silane)
Pressure = 25 < P < 100 millitorr
Power = 10 < Pw < 150 watts
Gas Flow = 10 < F < 50 sccm
Temperature = 23° C.
Growth Rate = 100 < GR < 1000 Å/min.

With the use of such a process amorphous silicon films may be formed on substrates or devices that have serious temperature limitations, thus extending the range of materials that can be used in such device applications. Also the growth rate in the improved concentric-electrode, hollow-cathode configuration of the invention is faster than that achievable with other PECVD configurations by about 15 times.

An example of the potential of this process is illustrated in the Table set forth in FIG. 10. The Table represents a comparison of a-Si:H film characteristics for a film resulting from conventional PECVD deposition processing (300° C.) versus a film produced by the HC-PECVD process (room temperature) of the invention and the effects of annealing those films in an inert gas. The Table shows the effect of annealing on the electrical conductivity of HC-PECVD room temperature deposited a-Si:H. It will be seen that after being annealed for 20 hours, the dark conductivity of an a-Si:H sample remains unchanged but the photo conductivity increases 3 fold. In addition, the activation energy also increases from 0.43 to 0.72 eV. As a result of this annealing, both the activation energy and conductivity of HC-PECVD deposited a-Si:H approach the characteristics of conventional 300° C. PECVD deposited a-Si:H but with a much higher deposition rate, i.e., 15 to 1.

Because of the extremely high growth or deposition rate at low temperature achievable with this HC-PECVD system, a number of potential applications become feasible. These applications include the fabricating of wide bandgap materials such as: microcrystalline, poly- and epitaxy silicon at low temperature; silicon carbide; boron nitride; and diamond.

A further application is the deposition of insulators, silicon dioxide or silicon nitride, at room temperature at a fast rate for use as an interlevel passivation layer. Additionally, alloying amorphous silicon with germanium to allow tuning of the bandgap at low temperature for optoelectric circuits is another potential process for this system. Furthermore, all of these films could be deposited through a photoresist mask for special applications because of the extremely low temperature of deposition.

It will be appreciated by those of skill in the art in view of the foregoing description that the disclosed concentric-confining-electrode reactor may be used in a large number of applications with various gases, materials, and configurations to produce improved plasma treatment of workpieces in the depositing or growing of films thereon or the etching of patterns therein and the like.

What is claimed is:

1. Apparatus for treating the surface of a workpiece using plasma-enhanced chemical vapor processing in a reaction chamber, comprising:
   a first electrode;
   means for supporting a workpiece, with a surface to be treated, at said first electrode;
   a second electrode surrounding said first electrode and said workpiece supporting means, said second electrode having an inner wall defining the wall of said reaction chamber and acting as a confining electrode with respect to said first electrode;
   means for providing a supply of reacting gas to flow into said reaction chamber between said electrodes; and
   means for applying electrical power to said electrodes to produce from said reacting gas a confined plasma with hollow-cathode effect at the surface of a workpiece supported on said supporting means in said reaction chamber, and wherein, said workpiece surface comprises a plurality of elements having surfaces to be treated by said plasma; and said supporting means comprises means for holding said plurality of elements in electrical contact with said first electrode and spaced from each other to accomodate said plasma between them, whereby said surface of said workpiece is treated by said plasma with a hollow-cathode effect.

2. Apparatus as in claim 1 wherein said elements of said workpiece comprise a plurality of wafers spaced from each other to accomodate said plasma between them.

3. Apparatus as in claim 2 wherein said second electrode is elongated and has an elongated axis and said first electrode comprises an elongated member with its elongated axis extending parallel to the elongated axis of said second electrode and said wafers are each disposed perpendicularly with respect to the elongated axis of said second electrode.

4. Apparatus as in claim 3 wherein said second electrode and said first electrode containing said wafers are concentrically arranged.

5. Apparatus as in claim 2 wherein said second electrode is elongated and has an elongated axis and said first electrode comprises an elongated member with its elongated axis extending parallel to the elongated axis of said second electrode and said wafers are each disposed parallel to the elongated axis of said second electrode.

6. Apparatus as in claim 2 wherein said wafers are of a material selected from the group consisting of silicon, germanium, gallium arsenide, plastic, and glass.

7. Apparatus as in claim 1 further comprising a solid wall surrounding said reaction chamber and a sealing means, at each end of said surrounding wall, for vacuum sealing the interior of said wall; and wherein said first electrode comprises an elongated member supported on one of said sealing means and extending into said chamber; and said means for supporting a workpiece is mounted on said elongated member.

8. Apparatus as in claim 7 wherein said second electrode is supported on the sealing means opposite said sealing means supporting said first electrode.

9. Apparatus as in claim 1 wherein said second electrode comprises a solid wall surrounding said reaction chamber and further comprising means, at each end of said wall, for closing off and vacuum sealing the interior of said wall.

10. Apparatus as in claim 1 further comprising a solid wall surrounding said reaction chamber and a sealing means, at each end of said wall, for vacuum sealing the interior of said wall, and wherein one of said sealing means comprises an end member and a double-flanged member, sealingly disposed between said wall and said end member, and said means for providing a supply of reacting gas between said electrodes comprises means in said double-flanged member for admitting said supply of reacting gas to said reaction chamber.

11. Apparatus as in claim 10 further comprising means, in said double-flanged member, for sensing the interior pressure of said chamber.

12. Apparatus as in claim 1 further comprising a solid wall surrounding said reaction chamber and a sealing means, at each end of said wall, for vacuum sealing the interior of said wall, and wherein said wall comprises a quartz tube and said sealing means comprise stainless steel end caps.

13. Apparatus as in claim 1 wherein said first and second electrodes are of silicon carbide.

14. Apparatus as in claim 1 wherein said means for applying electrical power to said electrodes comprises a source of rf energy.

15. Apparatus as in claim 14 further comprising means for grounding said second electrode.

16. Apparatus as in claim 1 wherein said means for providing a supply of reacting gas between said electrodes comprises means for producing a flow of gas through said chamber.

17. Apparatus as in claim 1 further comprising means for heating the interior of said chamber.

18. A method for treating the surface of a workpiece using plasma-enhanced chemical vapor processing in a reaction chamber, comprising the steps of:

disposing a first electrode in said reaction chamber;

supporting a workpiece at said first electrode, said workpiece having a surface comprising a plurality of elements in electrical contact with said first electrode and spaced from each other to accomodate plasma between them;

providing a supply of reacting gas at the surface of said workpiece;

applying electrical power to said first electrode to excite said reacting gas to produce a plasma at the surface of said workpiece; and disposing a second electrode surrounding said first electrode and said workpiece, said second electrode having an inner wall defining said reaction chamber, for confining said plasma in the region of the surface of said workpiece and in the spaces between said elements, whereby said workpiece surface is treated by said plasma with a hollow-cathode effect.

19. A method as in claim 18 wherein said reacting gas comprises silane, the pressure in said reaction chamber is in the range from 25 to 100 millitorr, and the gas is supplied at a rate in the range from 10 to 50 sccm to deposit hydrogenated amorphous silicon on the surface of said workpiece.

20. A method as in claim 19 wherein said elements comprising said workpiece surface comprise silicon wafers in electrical contact with said first electrode.

21. A method as in claim 19 wherein said chamber is maintained at room temperature.

22. A method as in claim 19 wherein said electrical power is in the range from 10 to 150 watts.

23. A method as in claim 18 further comprising the step of adjusting the pressure in said reaction chamber relative to the workpiece element spacing to optimize the plasma reaction with the workpiece surface.

24. A method as in claim 18 further comprising the step of adjusting the flow rate of said supply of reacting gas to the surface of said workpiece relative to the workpiece element spacing to optimize the plasma reaction with the workpiece surface.

25. A method as in claim 18 further comprising the step of adjusting the applied electrical power relative to the workpiece element spacing to optimize the plasma reaction with the workpiece surface.

* * * * *